United States Patent
Belgacem

(10) Patent No.: US 7,122,889 B2
(45) Date of Patent: Oct. 17, 2006

(54) SEMICONDUCTOR MODULE

(75) Inventor: Haba Belgacem, Cupertino, CA (US)

(73) Assignee: Rambus, Inc., Los Altos, CA (US)

( * ) Notice: Subject to any disclaimer, the term of this patent is extended or adjusted under 35 U.S.C. 154(b) by 85 days.

(21) Appl. No.: 10/894,693

(22) Filed: Jul. 19, 2004

(65) Prior Publication Data
US 2004/0262737 A1 Dec. 30, 2004

Related U.S. Application Data

(60) Division of application No. 10/087,395, filed on Mar. 1, 2002, now abandoned, which is a continuation-in-part of application No. 09/564,064, filed on May 3, 2000, now Pat. No. 6,449,159.

(51) Int. Cl.
H01L 23/48 (2006.01)

(52) U.S. Cl. .................................. 257/696
(58) Field of Classification Search ........... 257/696
See application file for complete search history.

(56) References Cited

U.S. PATENT DOCUMENTS

| | | |
|---|---|---|
| 3,868,724 A | 2/1975 | Perrino |
| 4,879,588 A | 11/1989 | Ohtsuka et al. |
| 5,224,023 A * | 6/1993 | Smith et al. .............. 361/784 |
| 5,229,916 A * | 7/1993 | Frankeny et al. .......... 361/718 |
| 5,518,964 A | 5/1996 | DiStefano et al. |
| 5,550,406 A | 8/1996 | Mccormick |
| 5,703,436 A | 12/1997 | Forrest et al. |
| 5,751,553 A * | 5/1998 | Clayton .................. 361/749 |
| 5,763,952 A | 6/1998 | Lynch et al. |
| 5,777,345 A | 7/1998 | Loder et al. |
| 5,804,004 A | 9/1998 | Tuckerman et al. |
| 5,925,934 A | 7/1999 | Lim |
| 5,926,951 A | 7/1999 | Khandros et al. |
| 5,936,850 A | 8/1999 | Takahashi et al. |
| 5,949,657 A | 9/1999 | Karabatsos |
| 5,998,864 A | 12/1999 | Khandros et al. |
| 6,002,589 A | 12/1999 | Perino et al. |
| 6,005,778 A | 12/1999 | Spielberger et al. |
| 6,023,103 A | 2/2000 | Chang et al. |
| 6,034,878 A | 3/2000 | Osaka et al. |
| 6,072,700 A | 6/2000 | Nam |
| 6,093,969 A | 7/2000 | Lin |

(Continued)

OTHER PUBLICATIONS

U.S. Appl. No. 10/071,298, filed Feb. 7, 2002, Haba.

(Continued)

Primary Examiner—Lex H. Malsawma
(74) Attorney, Agent, or Firm—Morgan, Lewis & Bockius LLP

(57) ABSTRACT

The semiconductor module includes a substrate, at least one semiconductor, and electrical contacts. The substrate includes a base layer having a substantially planar base layer first surface opposing a substantially planar base layer second surface. The base layer first surface is exposed to atmosphere and where the base layer is electrically conductive. The substrate also includes an insulator layer having a substantially planar insulator layer first surface opposing a substantially planar insulator layer second surface. The base layer second surface and the insulator layer first surface are adjacent and contiguous to one another and where the insulator layer is electrically non-conductive. Finally, the substrate includes a conductive layer having a substantially planar conductive layer first surface opposing a substantially planar conductive layer second surface. The insulator layer second surface and the conductive layer first surface are adjacent and contiguous to one another and where the conductive layer is electrically conductive.

53 Claims, 12 Drawing Sheets

U.S. PATENT DOCUMENTS

| | | |
|---|---|---|
| 6,133,629 A | 10/2000 | Han et al. |
| 6,180,881 B1 | 1/2001 | Isaak |
| 6,181,002 B1 | 1/2001 | Juso et al. |
| 6,184,587 B1 | 2/2001 | Khandros et al. |
| 6,215,182 B1 | 4/2001 | Ozawa et al. |
| 6,229,217 B1 | 5/2001 | Fukui et al. |
| 6,376,904 B1 | 4/2002 | Haba et al. |
| 6,449,159 B1 | 9/2002 | Haba |
| 6,514,794 B1 | 2/2003 | Haba et al. |
| 6,520,789 B1 | 2/2003 | Daugherty, Jr. et al. |
| 6,532,157 B1 | 3/2003 | Glenn et al. |
| 6,618,938 B1 | 9/2003 | Alagaratnam et al. |
| 6,721,189 B1 | 4/2004 | Haba |

OTHER PUBLICATIONS

U.S. Appl. No. 10/087,395, filed Mar. 1, 2002, Haba.
U.S. Appl. No. 09/531,124, filed Mar. 17, 2000, Haba.

* cited by examiner

SEMICONDUCTOR MODULE

This application is a divisional application of U.S. application Ser. No. 10/087,395, filed Mar. 1, 2002, now abandoned which application is a continuation-in-part of U.S. application Ser. No. 09/564,064, filed May 3, 2000, now U.S. Pat. No. 6,449,159 which applications are incorporated herein by reference in their entirety.

TECHNICAL FIELD

The present invention relates generally to semiconductor packaging and in particular to a semiconductor module made from a layered substrate.

BACKGROUND OF THE INVENTION

The semiconductor industry is constantly producing smaller and more complex semiconductors, sometimes called integrated circuits or chips. This trend has brought about the need for smaller semiconductor packages with smaller footprints, higher lead counts, and better electrical and thermal performance, while at the same time meeting accepted reliability standards.

In recent years a number of microelectronic packages have been produced to meet the need for smaller chip packaging. One such package is referred to as a Chip Scale Package (CSP). CSPs are so called because the total package size is similar or not much larger than the size of the chip itself. Typically, the CSP size is between 1 and 1.2 times the perimeter size of the chip, or 1.5 times the area of the die. One example of a CSP is a product developed by TESSERA® called "MICRO BGA" or μBGA. In a CSP, the semiconductor has a set of bond pads distributed across its surface. A first surface of an insulating, flexible film is positioned over the semiconductor surface. Interconnect circuitry is positioned within the film. Electrical connections are made between the interconnect circuitry and the semiconductor bond pads. Solder balls are subsequently attached to a second surface of the film in such a manner as to establish selective connections with the interconnect circuitry. The solder balls may then be attached to a printed circuit board.

CSPs may be used in connection with memory chips. Memory chips may be grouped to form in-line memory modules. In-line memory modules are surface mounted memory chips positioned on a circuit board.

As memory demands increase, so does the need for increased memory capacity of in-line memory modules. A need has also arisen for materials and methods that lead to increased performance by more closely matching the coefficient of thermal expansion of the materials used in these memory modules. Examples of such in-line memory modules are single in line memory modules or SIMMs and dual in-line memory modules or DIMMs. DIMMs have begun to replace SIMMs as the compact circuit boards of preference and essentially comprise a SIMM wherein memory chips are surface mounted to opposite sides of the circuit board with connectors on each side.

A problem with in-line memory modules is that adding more chips to the circuit board spreads out the placement of the chips on the circuit card and therefore requires reconfiguration of the circuit card connectors and their associated connections on the motherboard, which means replacing the memory card and in some cases the motherboard.

Another problem with current in-line memory modules is that a separate heat spreader must be positioned across a set of memory chips. The heat spreader adds cost to the assembly process and adds significant weight to the module.

To send a signal from one semiconductor module to another typically requires sending a signal along a channel or bus to a semiconductor module's electrical contacts, into the semiconductor module, along lead lines or traces to the semiconductor, and out through another contact terminal. Therefore, each semiconductor in the module requires its own set of electrical contacts and lead lines. Electrical contacts and lead lines for common inputs and outputs, such as power, or the like, are, therefore, duplicated.

Moreover, each lead or trace carrying current generates an electrical field around it, the strength of which is inversely proportional to the distance from the lead. To address interference caused by adjacent leads, current semiconductor module configurations require a grounded lead or trace to be placed between signal leads or traces, to negate the electric field. This problem is exacerbated in semiconductor modules where the leads are packed close to one another.

Furthermore, current semiconductor modules are typically coupled to a motherboard through the use of FR4 (Flame Retardant 4) circuit board edge connectors that slidably engage female connector slots. A FR4 circuit board is a widely-used insulating material for making printed circuit boards and is constructed of woven glass fibers (fiberglass) that are epoxied together. A the high number of contacts on such circuit boards requires a relatively hard force to be applied to the circuit board to insert it into the female connector slot. This high force may damage the circuit board or female slot.

In addition, due to the sheer number of electrical contacts on each module, the motherboard to which the semiconductor module connects must be constructed from six or more layers of channel or bus wiring layered between wafers of insulating material. These buses allow the various computer components to communicate with one another. It would be desirable to decease the number of leads and electrical contacts needed per semiconductor module, which would reduce the complexity of such motherboards by requiring less layers, thereby, substantially lowering the cost of the overall computing system.

In view of the foregoing it would be highly desirable to provide a semiconductor module that addresses the above described drawbacks of existing semiconductor modules.

SUMMARY OF THE INVENTION

According to the invention there is provided a semiconductor module. The semiconductor module having a substrate, at least one semiconductor, and electrical contacts. The substrate includes a base layer having a substantially planar base layer first surface opposing a substantially planar base layer second surface. The base layer first surface is exposed to atmosphere and where the base layer is electrically conductive. The substrate also includes an insulator layer having a substantially planar insulator layer first surface opposing a substantially planar insulator layer second surface. The base layer second surface and the insulator layer first surface are adjacent and contiguous to one another and where the insulator layer is electrically non-conductive. Finally, the substrate includes a conductive layer having a substantially planar conductive layer first surface opposing a substantially planar conductive layer second surface. The insulator layer second surface and the conductive layer first surface are adjacent and contiguous to one another and where the conductive layer is electrically conductive.

The at least one semiconductor and the electrical contacts are both adjacent and electrically coupled to the conductive layer and are disposed in substantially the same plane as one another at opposing ends of the substrate. The base layer is substantially thicker than the insulator and conductive layers, while the insulator layer is thicker than the conductive layer.

Further, according to the invention there is provided another semiconductor module. This semiconductor module has a substrate comprising at least two legs joined by a resilient bend. The bend is configured to compressibly engage with a female connector. The substrate includes an insulator layer that is non-conductive and a conductive layer adjacent and contiguous to the insulator layer. This semiconductor module also has at least one semiconductor both adjacent and electrically coupled to the conductive layer and electrical contacts both adjacent and electrically coupled to the conductive layer.

Still further according to the invention there is provided yet another semiconductor module. This semiconductor module includes a substrate comprising substantially parallel first and second legs joined by a bend, the bend configured to engage with a female connector. The substrate includes an insulator layer that is non-conductive and a conductive layer adjacent and contiguous to the insulator layer. This semiconductor module also includes at least one semiconductor adjacent and electrically coupled to the conductive layer, a first set of electrical contacts located on the first leg near the bend, and a second set of electrical contacts located on the second leg near the bend. At least some of the first set of electrical contacts are electrically coupled to the conductive layer, while at least one of the first set of electrical contacts and at least one of the second set of electrical contacts are electrically coupled to one another.

Even further, a method for making a semiconductor module is provided. A substantially planar substrate is formed by providing a base layer that is conductive, applying an insulator layer onto the base layer, and coating the insulator layer with a conductive layer. Traces and electrical contacts are then etched onto the conductive layer. A semiconductor is then electrically coupled to the conductive layer. Finally, the substrate is bent near the electrical contacts through an angle of approximately less than 180 degrees.

The above described semiconductor reduces the complexity and cost of semiconductor modules. Electric charge and heat are dissipated through the base layer without requiring the addition of grounding lines or a heat spreader. What is more, the resilient nature of the bend allows the semiconductor module to be securely coupled to a female connector on a motherboard. Common leads and electrical contacts reduce the overall number of leads and electrical contacts, thereby, reducing unit cost and requiring a motherboard with fewer distinct layers or channels. Finally, the negative impact on the performance of signal transmission caused by vias through a printed circuit board is eliminated by providing a shorting lead to short electrical contacts to one another.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE PREFERRED EMBODIMENTS

Figure 1:
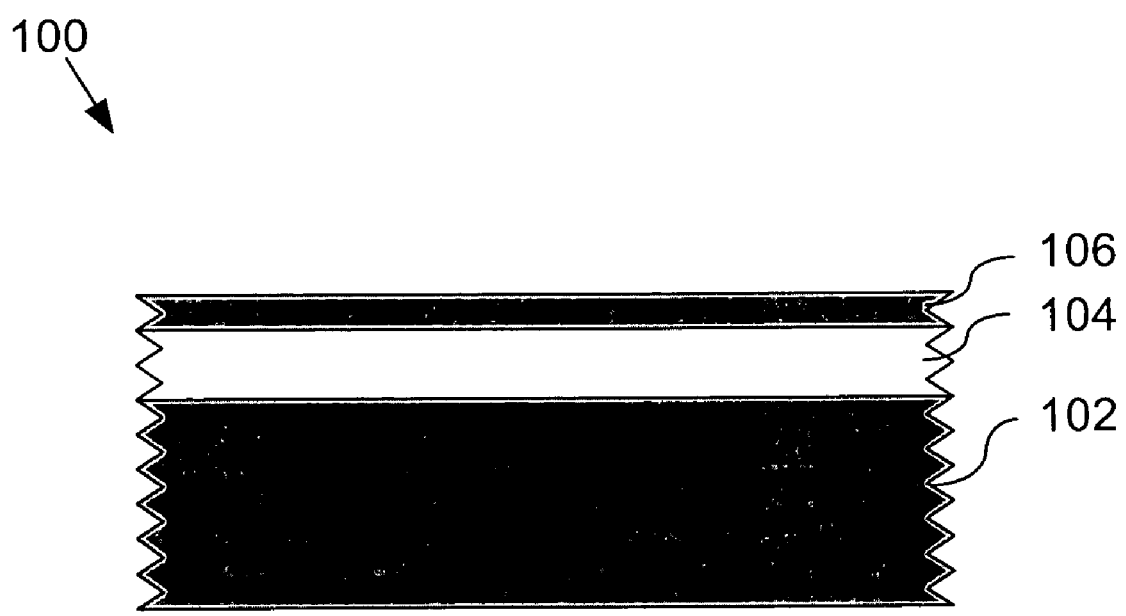
FIG. 1 is a partial cross-sectional view of a metal core or substrate used by a memory module according to an embodiment of the invention.

FIG. 1 is a partial cross-sectional view of a metal core or substrate 100 used by a memory module according to an embodiment of the invention. In a preferred embodiment, there are three substantially planar layers, a base layer 102, an insulator layer 104, and a conductive layer 106. The base layer 102 is preferably formed of a malleable metal having a thickness of between 100 and 500 micrometers, and more preferably between 200 and 300 micrometers. The malleable metal is preferably copper, bronze, stainless steel, aluminum, or the like. One side of the base layer 102 is exposed.

The insulator layer 104 is preferably an electrical insulator, such as a polyimide, an epoxy, TEFLON, or any suitable synthetic resin resistant to high temperatures, wear, and corrosion, while being thermally conducive, electrically non-conductive, and capable of being used as a coating or film on base layer 102. The insulator layer 104 is preferably between 25 and 100 micrometers thick. As will be appreciated by one skilled in the art, the thickness of the insulator layer 104 is chosen to provide an predetermined electrical impedance. The thickness of the insulator layer 104 is proportional to the dielectric constant of the insulator and the capacitance.

The conductive layer 106 is also preferably constructed from a metal having a thickness of 5 to 30 micrometers. The conductive layer 106 is preferably capable of being formed into patterned traces through any suitable process, such as etching, or the like. The patterned traces is formed from the conductive layer 106 on top of the electrically non-conductive insulator layer 104. The conductive layer 106 is preferably formed of a metal, such as copper, bronze, gold, or the like. Also, any heat generated in the conductive layer 106 is preferably thermally conducted through the insulation layer 104 to the base layer 102 which acts as a heat spreader to absorb, spread, and dissipate the heat. This eliminates the need for an additional heat spreader, thereby, reducing the overall cost of the semiconductor module.

The preferred ratio of the thickness of the base layer 102 to the insulating layer 104 is about 3, while the preferred ratio of the thickness of the base layer 102 to the conductive layer 106 is about 14. The ratio of a thickness of the insulator layer to said conductive layer is approximately 5.

In an alternative embodiment, no base layer 102 is present. In this embodiment, the insulator layer is formed from an electrically non-conductive material, while the conductive layer 106 is formed from a conductive material, such as a metal. In this embodiment, traces are formed from the conductive layer 106 on top of the electrically non-conductive insulator layer 104.

Figure 2:
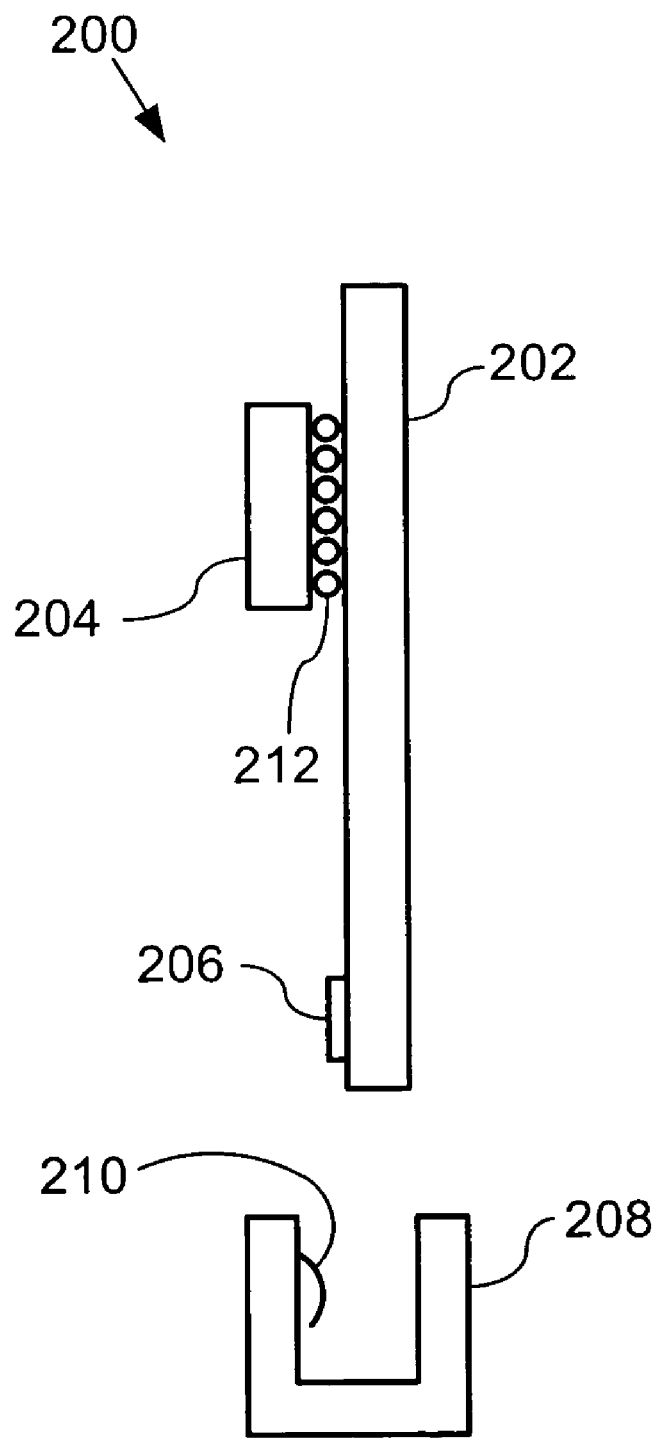
FIG. 2 is a side view of an embodiment of a semiconductor module according to another embodiment of the invention.

FIG. 2 is a side view of an embodiment of a semiconductor module 200 according to an embodiment of the invention. The semiconductor module 200 includes a substrate 202 similar to the substrate 100 shown and described in relation to FIG. 1. The substrate 202 is preferably formed from a standard three layer metal core or substrate material as described above. A conductive layer 106 (FIG. 1) of the substrate 202 is electrically coupled to at least one semiconductor die 204 by solder balls 212. Suitable semiconductors are CSPs described above. Also coupled to the conductive layer 10 (FIG. 1) of the substrate 202 is one or more electrical contacts 206.

To connect the semiconductor module 200 to a channel, the semiconductor module 200 is slid into a female connector 208. A "channel," as used herein, is any bus that communicates data signals, address signals, control signals, or the like. The electrical contacts 206 make electrical contact with other electrical contacts 210 in the female connector 208. The other electrical contacts 210 are preferably spring loaded and biased towards the center of the female connector 208. When coupled, the electrical contacts 206 bend the other electrical contacts 210 away from the center of the female connector 208. This securely grips the semiconductor module 200 in the female connector 208. The other electrical contacts 210 are in turn electrically coupled to the channel or bus (not shown) on a motherboard (not shown).

This embodiment utilizes standard metal core or substrate products with little modification. The conductive layer of the substrate is etched into the desired traces, and semiconductor(s) 204 are electrically coupled to these etched traces.

As described above, prior art semiconductor modules require grounding leads to be placed between leads running from the channel to the semiconductor(s). This is because an electric field formed around each lead interferes with a signal carried by an adjacent lead. This problem is exacerbated when leads are placed close to one another. The electric field generated is governed by the following equation:

$$\text{Energy field} = \frac{(\text{dielectric constant})(\text{voltage across the lead})}{(\text{distance away from the lead})}$$

Therefore, the energy field is inversely proportional to the distance from the lead.

The above described embodiment reduces the need for placing grounding leads between existing leads, as any electrical field built up by a voltage across a lead is dissipated through the electrically conductive base layer 102 (FIG. 1). The electrically conductive base layer 102 (FIG. 1) is preferably grounded to discharge the electrical field built up across a lead.

Figure 3:
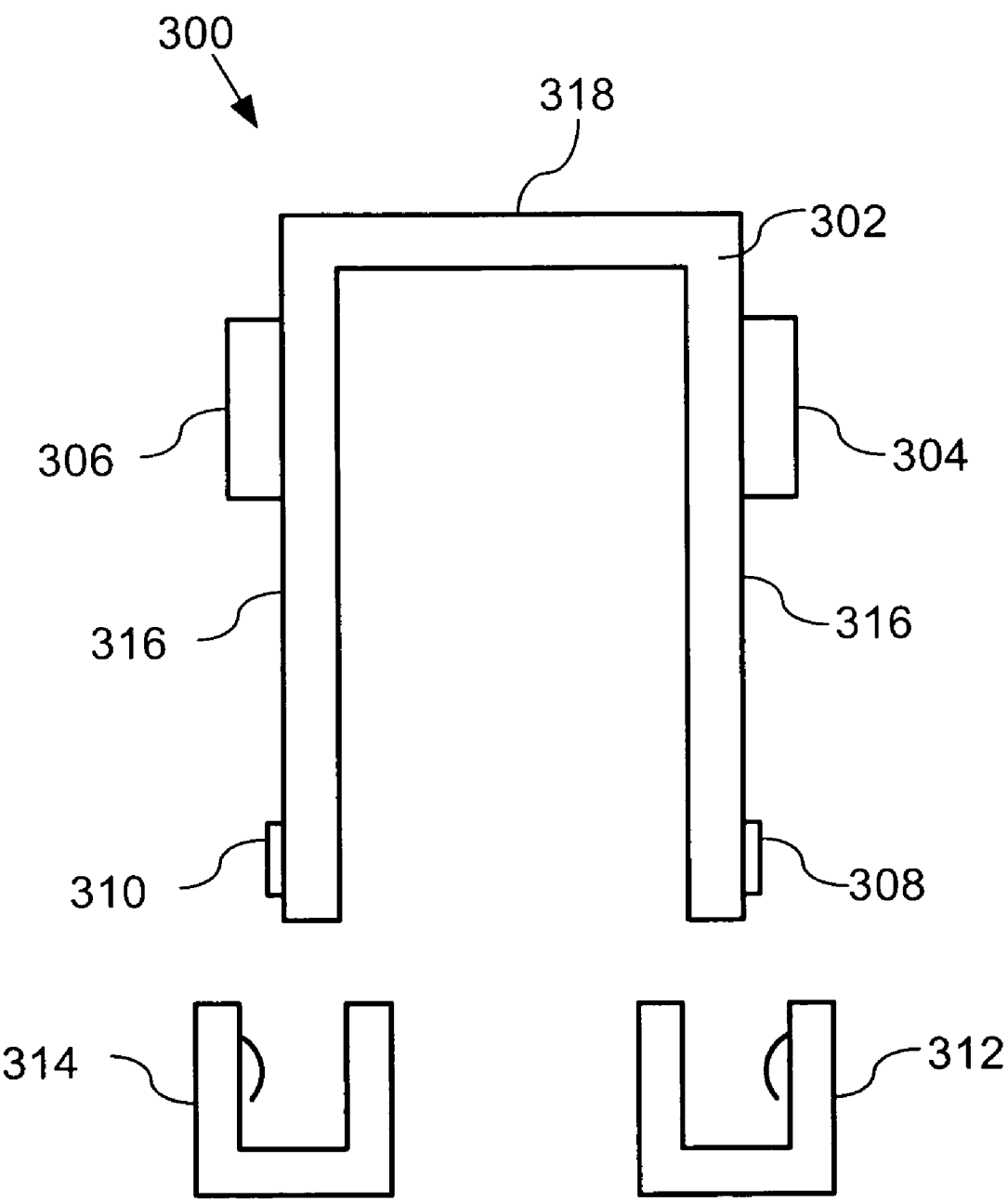
FIG. 3 is a side view of another semiconductor module according to another embodiment of the invention.

FIG. 3 is a side view of another semiconductor module 300 according to yet another embodiment of the invention. A substrate similar to that described in relation to FIG. 2 is formed into a "n" shape having two vertical legs 316 joined by a horizontal beam 318. Semiconductors 304 and 306 are coupled to the substrate on opposing sides of the substrate, i.e., opposite to one another on the outside of each leg 316. In a similar manner, electrical contacts 308 and 310 are coupled to the substrate on opposing sides of the legs, i.e., opposite to one another on the outside of each leg 316. Each leg 316 of the substrate is configured to engage a female connector 314 and 312, respectively. In this way, a single semiconductor module 300 can be used across multiple channels. By sharing electrical leads coupling the semiconductor dies 3.04 and 306 with the electrical contacts 308 and 310, across different channels, the number of leads and contacts may be reduced.

Figure 4:
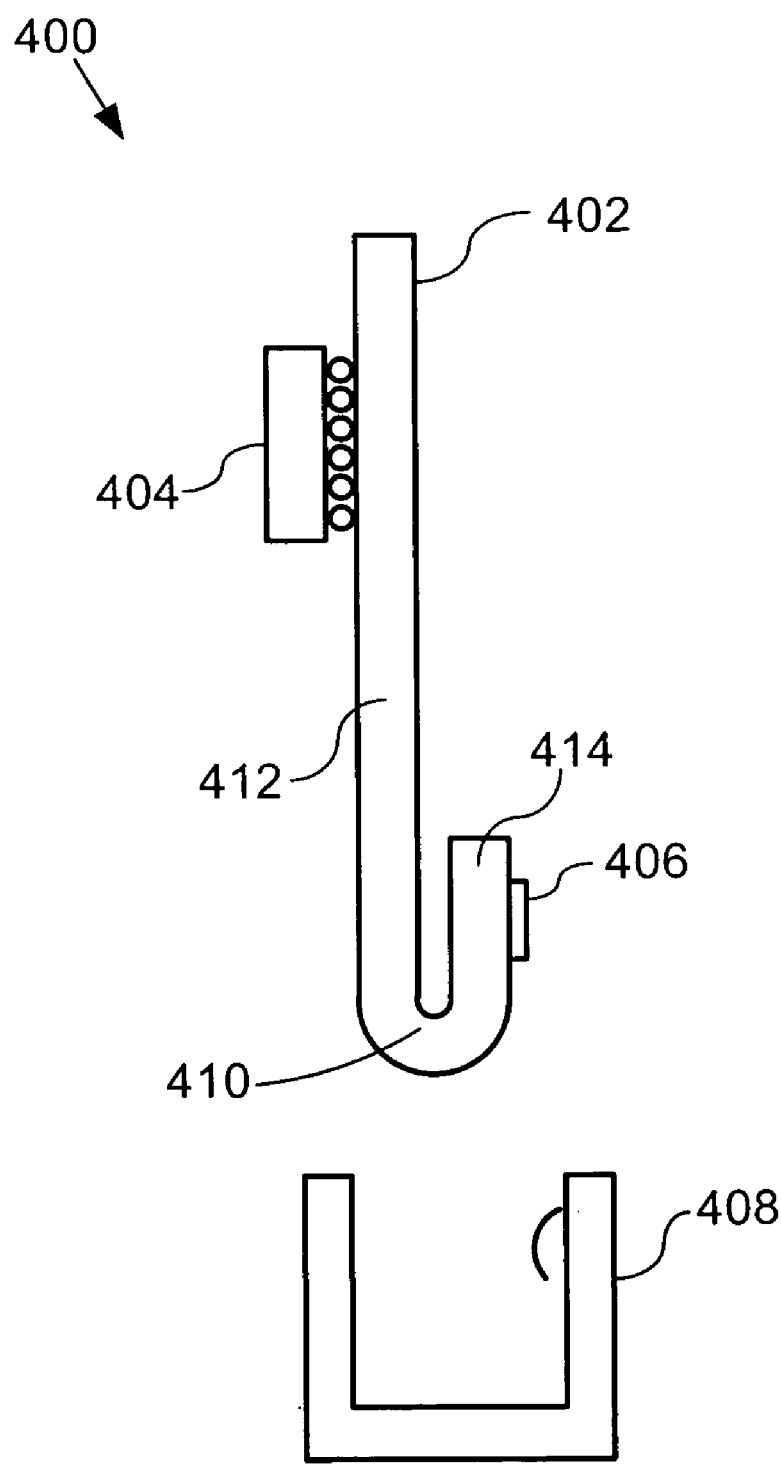
FIG. 4 is a side view of another semiconductor module according to yet another embodiment of the invention.

FIG. 4 is a side view of another semiconductor module 400 according to another embodiment of the invention. A substrate 402 having at least two layers as described in relation to FIG. 1, forms a first and second leg, 412 and 414 respectively, joined by a bend 410, thereby, defining a "j" shaped semiconductor module 400. In a similar manner to that described above in relation to FIGS. 2 and 3, a semiconductor die 404 and electrical contacts 406 are electrically coupled to one another via traces formed by a conductive layer forming part of the substrate 402. The electrical contacts 406 are positioned on the second leg near the bend 410. In use, the semiconductor module 400 is slid into a female connector 408 in a similar manner to that described above.

In a preferred embodiment, the bend is preferably resilient, i.e., the first and second legs 412 and 414 are flexible towards and away from one another. This allows the legs to be compressed towards one another when engaging with the female connector 408. The resiliency in the bend creates a force between the electrical contacts 406 and the female connector 408, thus ensuring electrical contact between the semiconductor module 400 and the female connector 408, while firmly holding the module in place. This embodiment requires that the substrate is constructed from a flexible or bendable and resilient material, such as some metals and plastics.

Figure 5A:
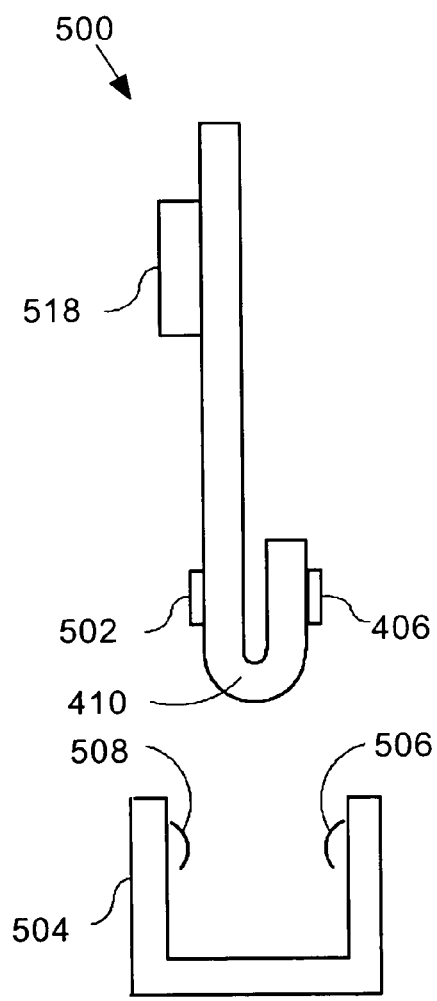
FIG. 5A is a side view of another semiconductor module according to still another embodiment of the invention.

FIG. 5A is a side view of another semiconductor module 500, according to another embodiment of the invention. Semiconductor module 500 is similar to the semiconductor module 400 shown in FIG. 4. However, semiconductor module 500 includes a second set of electrical contacts 502 opposing the first set of electrical contacts 406 on different legs. In use, the semiconductor module 500 is slid into a female connector 504, where electrical contacts 406 and 502, electrically couple with other electrical contacts 506 and 508, respectively.

Figure 5B:
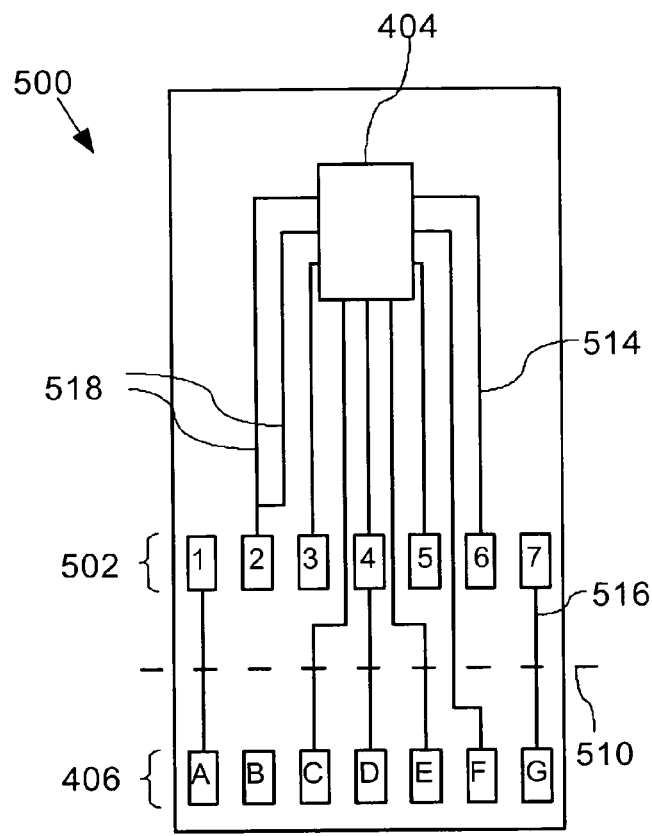
FIG. 5B is a front view of the semiconductor module of FIG. 5A before being formed into shape.

FIG. 5B is a front view of the semiconductor module 500 of FIG. 5A prior to being bent along fold line 510 to form bend 410. The first set of electrical contacts 406 are labeled A to G, i.e, 406(A) to 406 (G), while the second set of electrical contacts 502 are labeled 1 to 7, i.e, 502(1) to 502(7). Electrical leads 514 electrically couple the semiconductor die 404 to the electrical contacts 406 and 502. Typically, the semiconductor die 404 connects to distinct electrical contacts 406 and 502, however, in some instances it may be desirable to connect multiple leads 518 to the same electrical contact 502(2). One electrical lead may also be connected to two separate electrical contacts 502(4) and 406(D), such as where the same signal is to be transmitted along a channel to another module or electrical component coupled to the channel.

To form the bend 410 (FIG. 5A), the substrate is bent along fold line 510. This implies that the substrate is made of a malleable material. In an alternative embodiment, the semiconductor module 500 is initially formed with the bend 410 therein, such as by casting a substrate with a bend therein, and not by subsequently bending the substrate as described above.

If prior art semiconductor modules need to short electrical connector 508 to 506 (FIG. 5A) of the female connector 504 (FIG. 5A), they typically do so through an electrical via. To create a via a hole is created through an insulating material of a printed circuit board, such as FR4 (Flame Retardant 4), and the hole is plated with a conductor. However, the discontinuity of the via negatively impacts the performance of the signal transmission through the via.

Conversely, the current embodiment of the invention allows for a simple means of shorting the electrical connector 508 to 506 (FIG. 5A) of the female connector 504 (FIG. 5A), by connecting electrical contacts 502(7) to electrical contact 406(G) to one another by a shorting lead 516. This shorting means is a simple and highly efficient means for shorting the electrical connectors 508 and 506 (FIG. 5A) to one another and may be formed at the same time as the leads 514 are formed.

Figure 6:
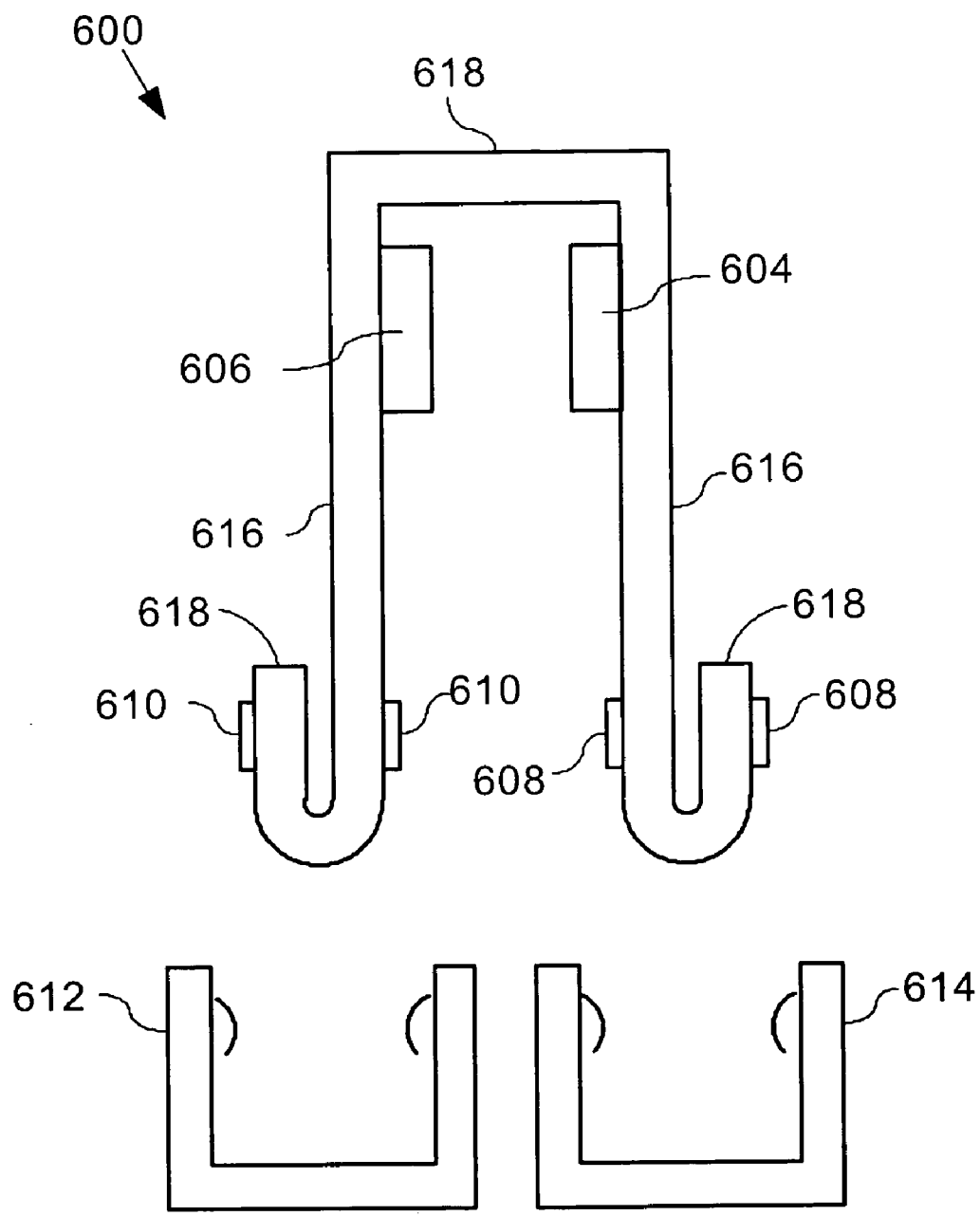
FIG. 6 is a side view of another semiconductor module, according to an embodiment of the invention.

FIG. 6 is a side view of another semiconductor module 600, according to another embodiment of the invention. A substrate similar to that described in relation to FIGS. 5A and 5B is formed into a "n" shape having two vertical legs 616 joined by a horizontal beam 618. Semiconductors 604 and 606 are coupled to the substrate on opposing sides of the legs 616, i.e., opposite one another on the inside of each leg 616. The lower part 618 of each leg 616 is bent outward away from the other leg through an angle of less or equal to 180 degrees into a "u" shaped extremity. The "u" shaped extremity preferably forms an acute angle between each of the legs 616 and the lower part 618 of each leg. Electrical contacts 608 and 610 coupled to the substrate on opposing sides of the "u" shaped extremities, i.e., opposite one another on each side of the "u" shaped extremity—one on each leg 616 and one on each lower part 618 of each leg. The electrical contacts 608 and 610 are configured to engage female connectors 614 and 612. In this way, a single semiconductor module 600 can span multiple channels. The number of leads and contacts may be reduced by the semiconductor dies 604 and 606 sharing leads and electrical contacts 608 and 610, across different channels.

Figure 7:
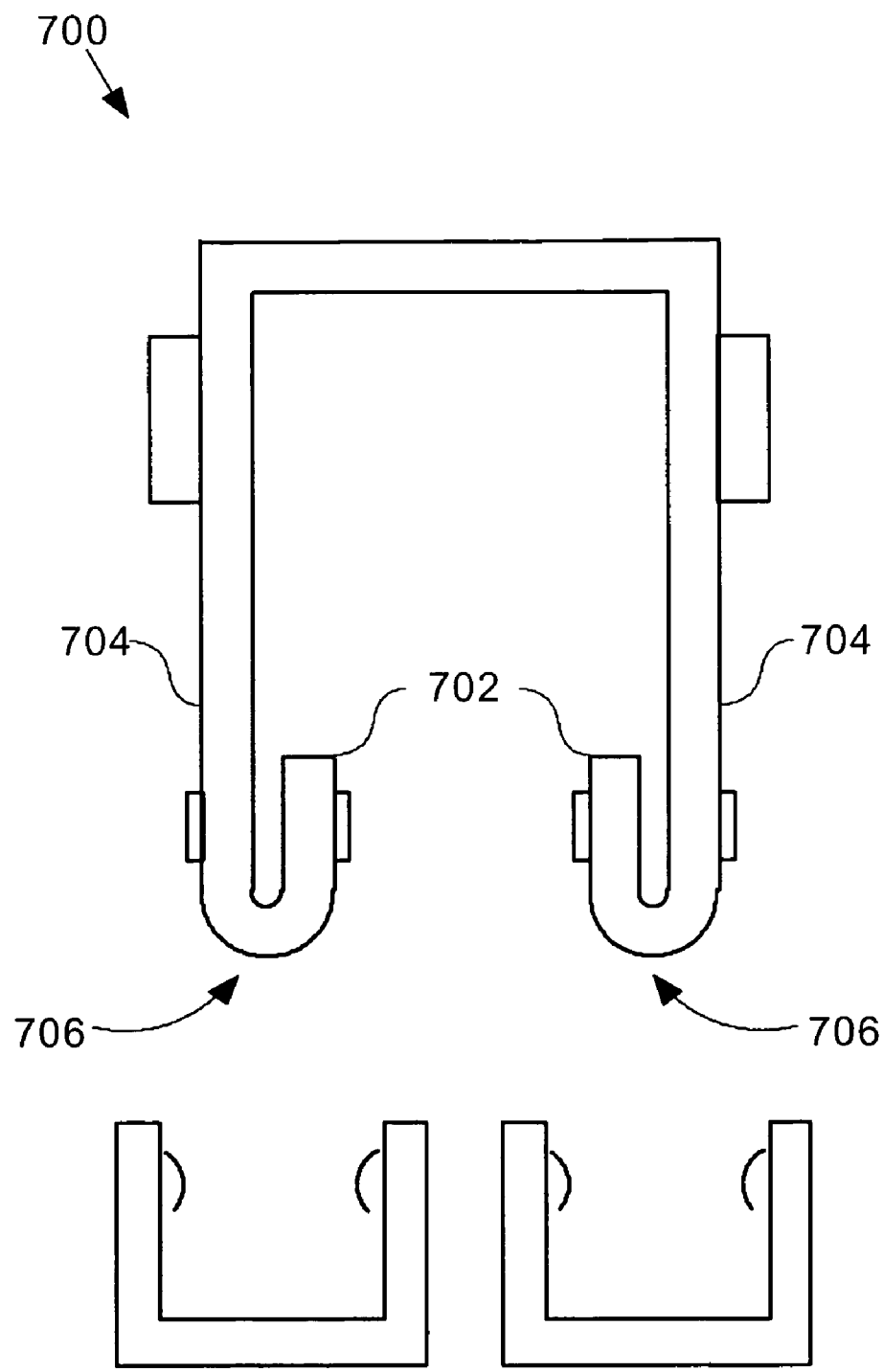
FIG. 7 is a side view of another semiconductor module according to another embodiment of the invention.

FIG. 7 is a side view of another semiconductor module 700, according to another embodiment of the invention. Semiconductor module 700 is similar to the semiconductor module 600 shown and described in relation to FIG. 6, however, the lower part 702 of each leg 704 is bent inward towards one another, through approximately 180 degrees or less into a "u" shaped extremity 706. The "u" shaped extremity 706 forms an acute angle between the lower part 702 of each leg and each leg 704.

Figure 8:
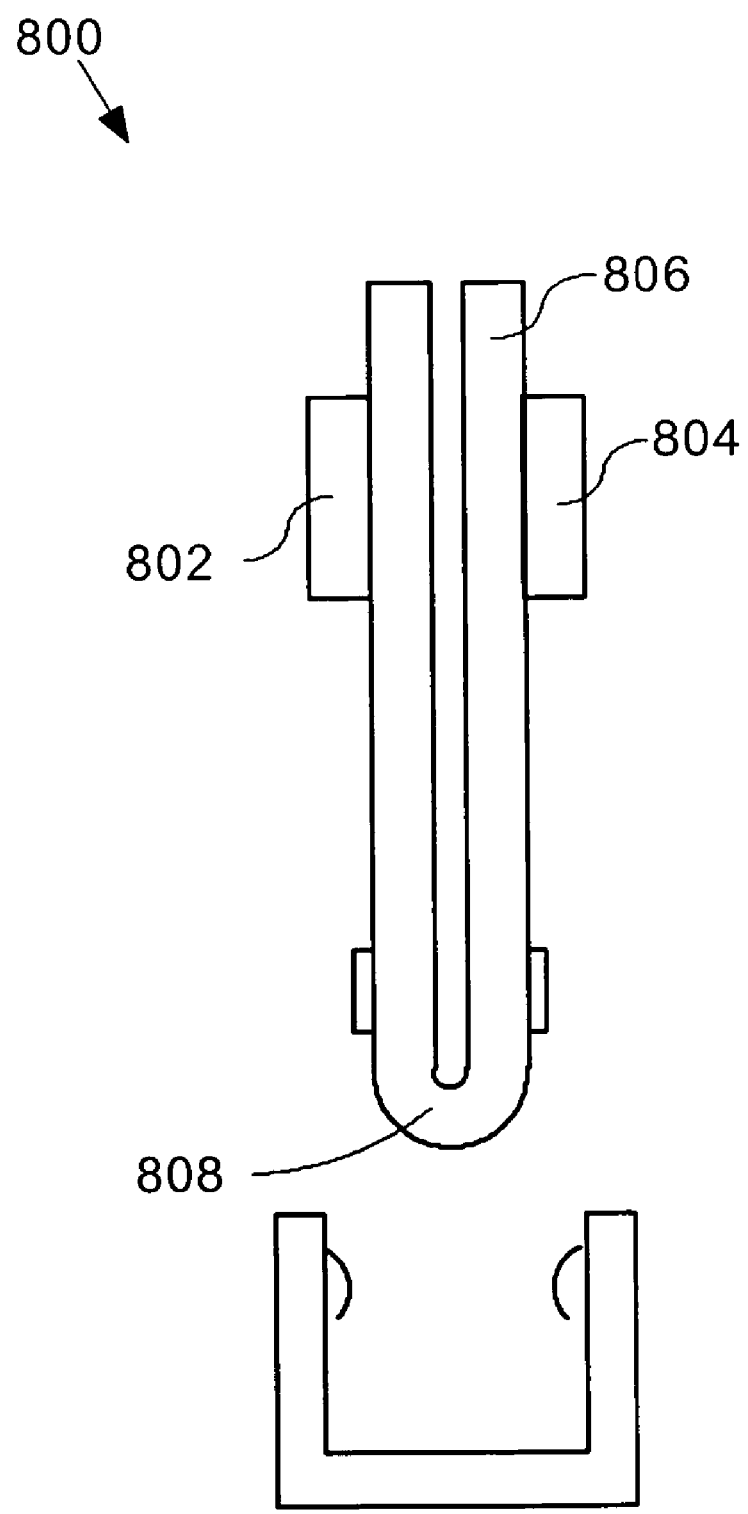
FIG. 8 is a side view of another semiconductor module according to still another embodiment of the invention.

FIG. 8 is a side view of another semiconductor module 800, according to another embodiment of the invention. Semiconductor module 800 is similar to semiconductor module 500 shown in FIG. 5A, however, semiconductor module 800 includes a second semiconductor die 802 opposing a first semiconductor die 804. A substrate 806 of the semiconductor module 800 is "u" shaped with a bend 808 formed at approximately halfway along its length.

Figure 9:
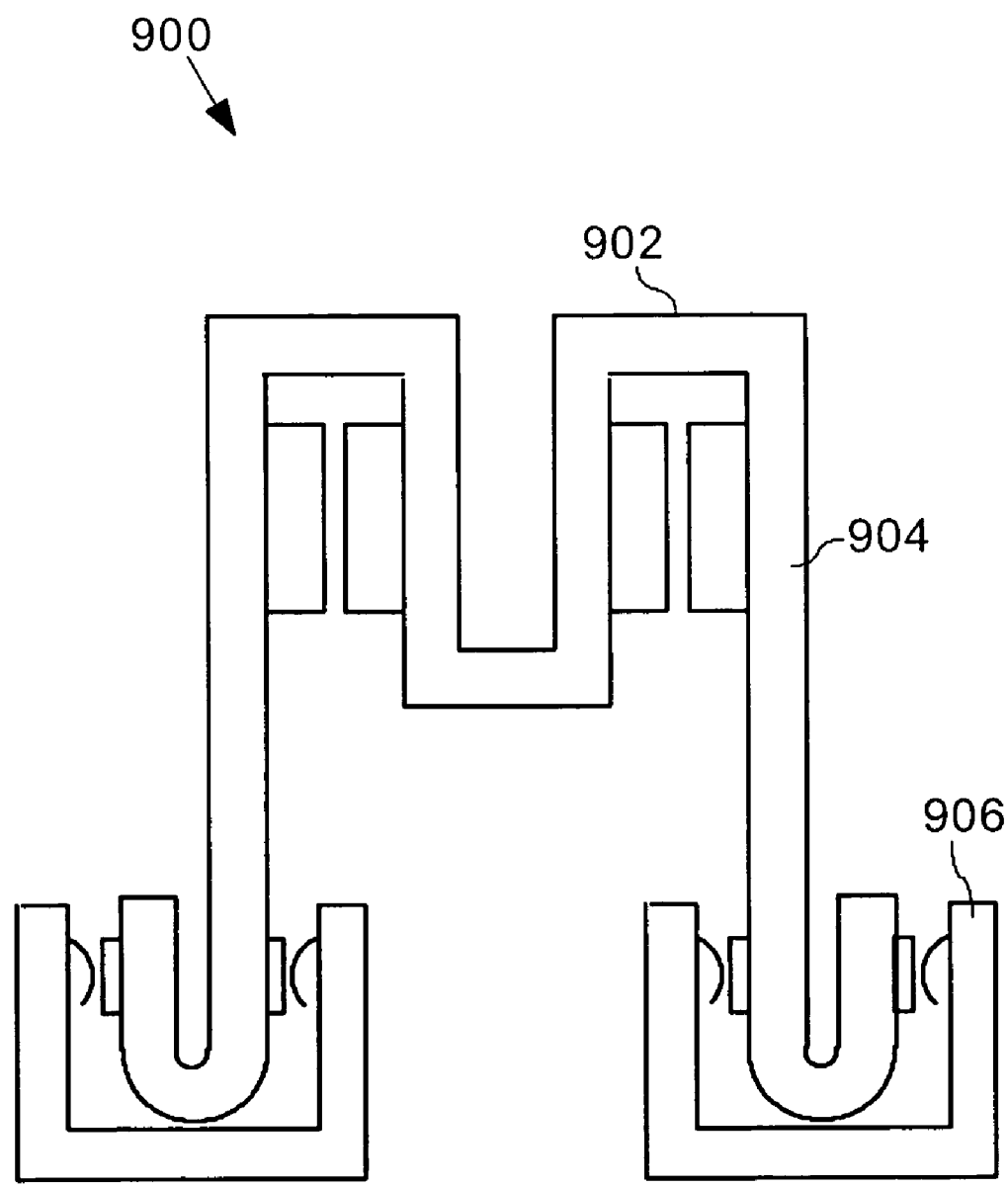
FIG. 9 is a side view of another semiconductor module according to still an embodiment of the invention.

FIG. 9 is a side view of another semiconductor module 900, according to another embodiment of the invention. Semiconductor module 900 is similar to semiconductor module 500 shown in FIG. 5A, however, semiconductor module 900 includes an additional bend in a horizontal beam 902, forming a "m" shape. The additional bend allows for the positioning of additional semiconductor dies, while increasing the surface area of the substrate for better heat dissipation. In this view, the semiconductor module is shown positioned within the female connectors 906.

Figure 10:
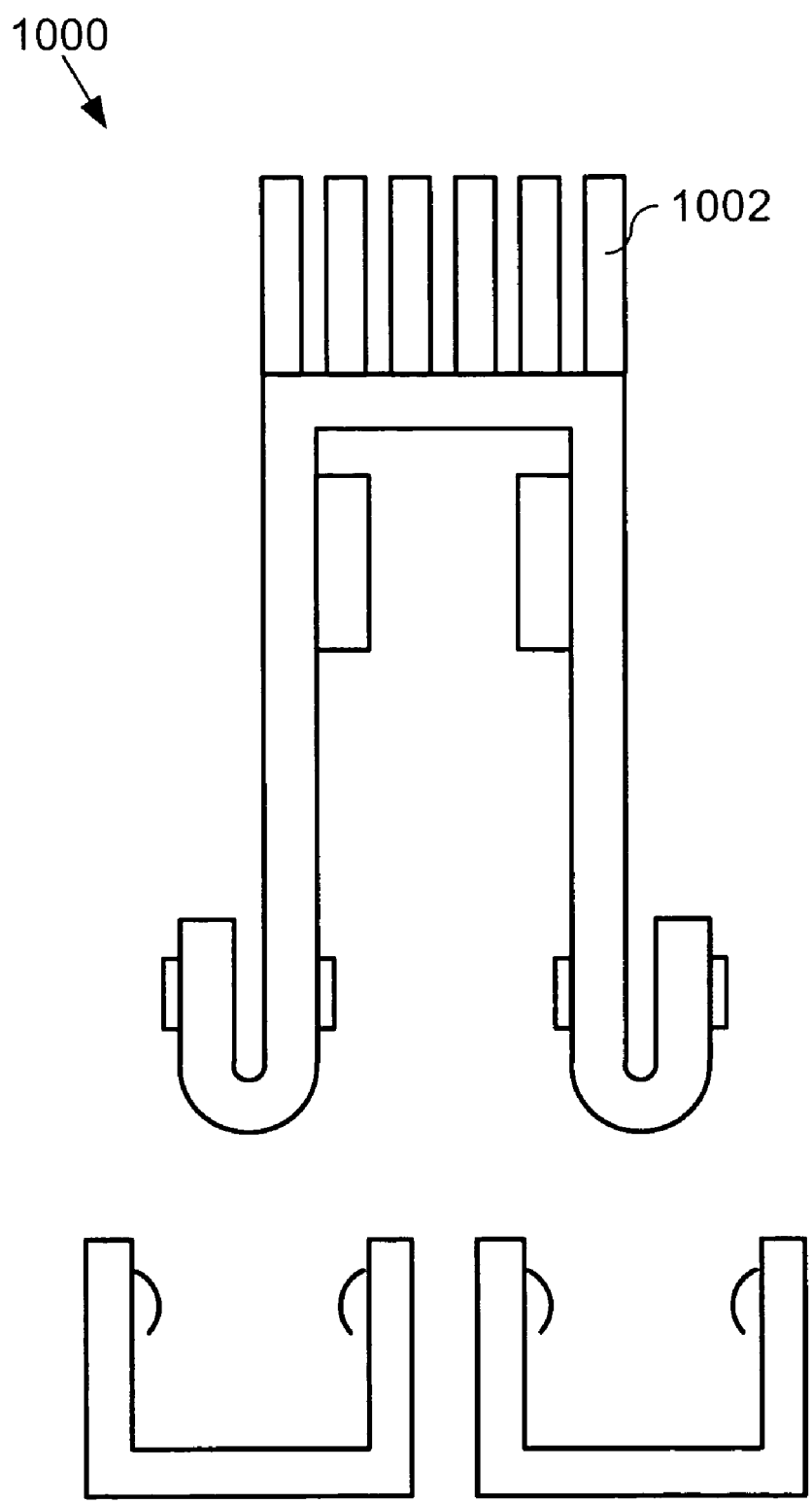
FIG. 10 is a side view of another semiconductor module according to even another embodiment of the invention.

FIG. 10 is a side view of another semiconductor module 1000, according to another embodiment of the invention. Semiconductor module 1000 is similar to semiconductor module 600 shown in FIG. 6, however, semiconductor module 1000 is thermally coupled to a heat spreader 1002 to better dissipate any heat built up in the semiconductor module.

Figure 11:
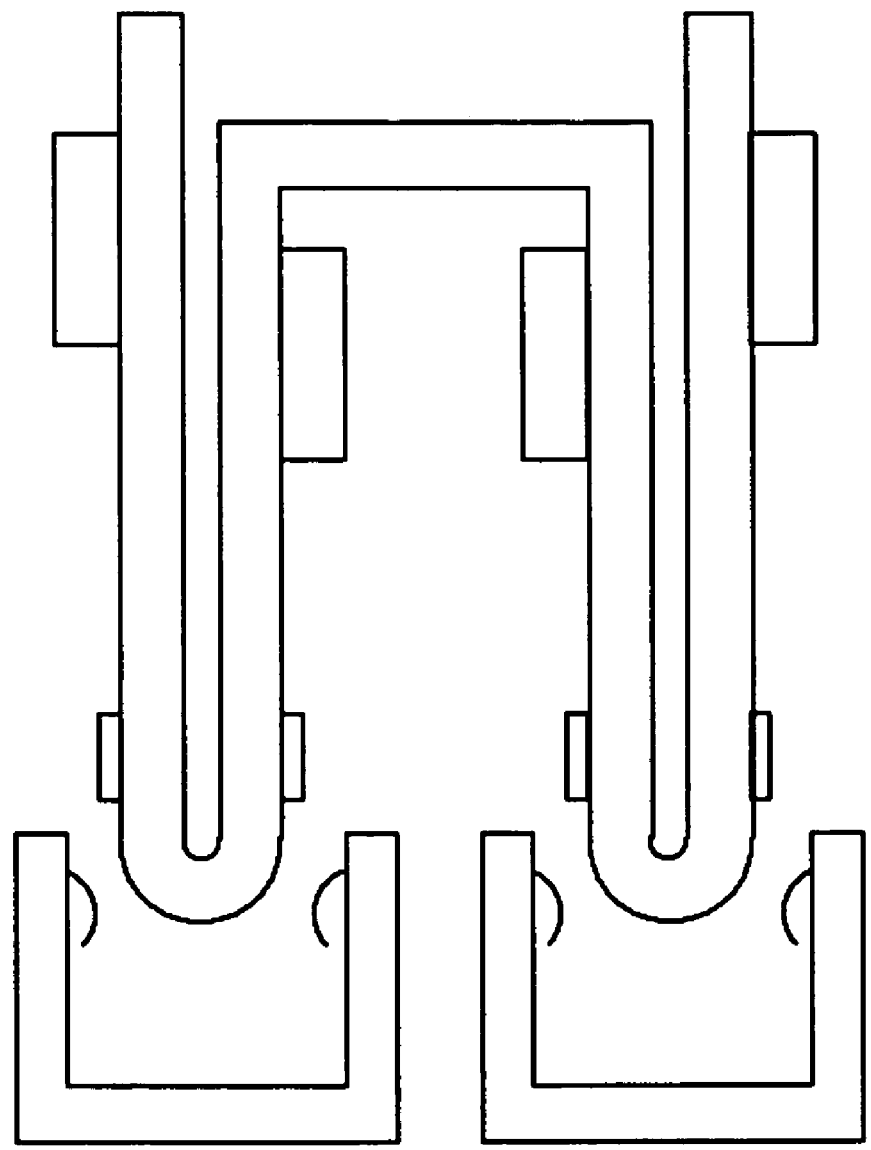
FIG. 11 is a side view of another semiconductor module according to an embodiment of the invention.

FIG. 11 is a side view of another semiconductor module 1100, according to yet another embodiment of the invention. Semiconductor module 1100 is a combination of the semiconductor modules 600 and 800 shown in FIGS. 6 and 8, respectively.

Figure 12:
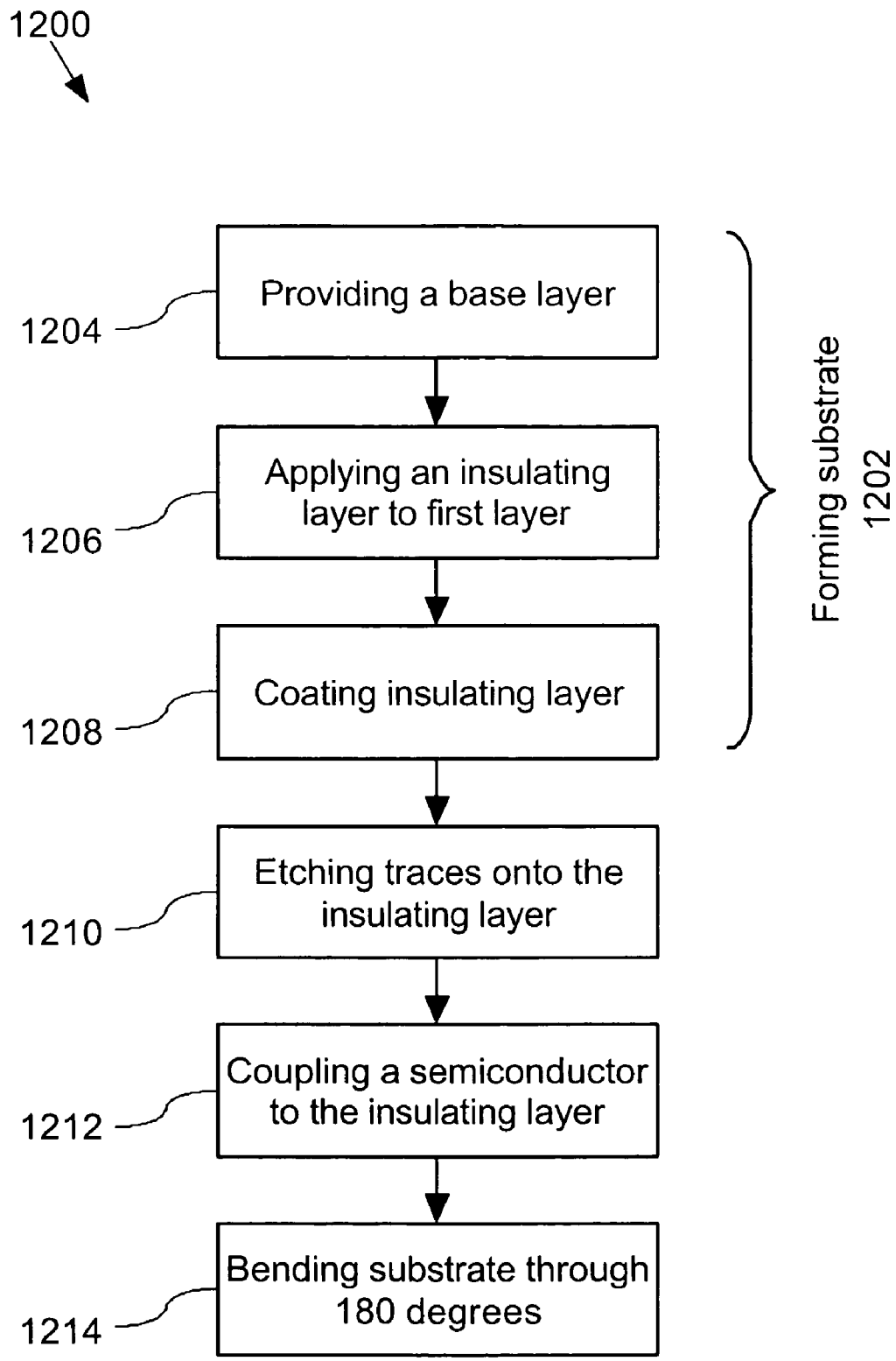
FIG. 12 is a flow chart of a method for making a semiconductor module.

FIG. 12 is a flow chart of a method 1200 for making a semiconductor module. First, a substantially planar substrate is formed, at 1202. This is accomplished by providing, at 1204, a base layer that is conductive, applying, at 1206, a non-conductive insulator layer onto the base layer, and coating, at 1208, the insulator layer with a conductive layer. Traces and electrical contacts are then etched, at 1210, onto the conductive layer. Subsequently, a semiconductor is electrically coupled, at 1212, to the conductive layer (traces). The substrate may then be bent, at 1214, near the electrical contacts through an angle of approximately 180 degrees or less to form a "u" shape.

As will be appreciated by one skilled in the art, the embodiments of the invention described above may include more than one semiconductor connected to the substrate. Common leads and electrical contacts may be utilized to reduce the overall number of leads and electrical contacts, thereby, reducing unit cost and requiring a motherboard with fewer distinct layers or channels.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, steps in the method are not necessarily intended to occur in the sequence described above. It is intended that the scope of the invention be defined by the following claims and their equivalents.

What is claimed is:

1. A semiconductor module comprising:
   a substrate comprising at least two legs joined by a resilient bend, said bend configured to compressibly engage with a female connector, said substrate comprising:
      an insulator layer that is non-conductive; and
      an at least partially conductive layer adjacent and contiguous to said insulator layer;
   at least one semiconductor both adjacent and electrically coupled to said conductive layer; and electrical contacts both adjacent and electrically coupled to said conductive layer.

2. The semiconductor module of claim 1, wherein said electrical contacts are located near where said bend and one of said legs join.

3. The semiconductor module of claim 2, further comprising additional electrical contacts located near where said bend and the other one of said legs join.

4. The semiconductor module of claim 3, wherein at least one of said electrical contacts and at least one of said additional electrical contacts are electrically coupled to each other.

5. The semiconductor module of claim 1, further comprising a base layer adjacent and contiguous to said insulator layer on an opposite side of said insulator layer to said conductive layer, where said base layer is electrically conductive.

6. The semiconductor module of claim 5, wherein said insulator, conductive, and base layers are made from a bendable material.

7. The semiconductor module of claim 5, wherein said base layer is substantially thicker than said insulator and conductive layers.

8. The semiconductor module of claim 5, wherein a ratio of a thickness of said base layer to said insulator layer is approximately 3.

9. The semiconductor module of claim 5, wherein a ratio of a thickness of said base layer to said at least partially conductive layer is approximately 14.

10. The semiconductor module of claim 5, wherein said base layer is approximately between 100 and 500 micrometers thick.

11. The semiconductor module of claim 5, wherein said base layer is made from a metal selected from a group consisting of: copper, bronze, stainless steel, aluminum and any combination of the afore-mentioned.

12. The semiconductor module of claim 5, wherein said base layer is configured to dissipate heat.

13. The semiconductor module of claim 5, wherein said base layer is configured to discharge electric charge.

14. The semiconductor module of claim 1, wherein said insulator layer is thicker than said conductive layer.

15. The semiconductor module of claim 1, wherein a ratio of a thickness of said insulator layer to said at least partially conductive layer is approximately 5.

16. The semiconductor module of claim 1, wherein said insulator layer is approximately between 25 and 100 micrometers thick.

17. The semiconductor module of claim 1, wherein said insulator layer is chosen to provide a predetermined electrical impedance.

18. The semiconductor module of claim 1, wherein said at least partially conductive layer is approximately between 5 to 30 micrometers thick.

19. The semiconductor module of claim 1, wherein said insulator layer is made from a material selected from a group consisting of: a polyimide, an epoxy, TEFLON and any combination of the afore-mentioned.

20. The semiconductor module of claim 1, wherein said at least partially conductive layer is at least partially made from a metal selected from a group consisting of:
copper, bronze, gold and any combination of the afore-mentioned.

21. The semiconductor module of claim 1, wherein said at least partially conductive layer forms patterned traces.

22. The semiconductor module of claim 1, wherein an acute angle is formed at said bend between said legs.

23. The semiconductor module of claim 1, wherein said legs are substantially straight and parallel to one another.

24. The semiconductor module of claim 1, wherein one of said legs is substantially shorter than the other of said legs.

25. The semiconductor module of claim 1, wherein said substrate has a "j" shape.

26. The semiconductor module of claim 1, wherein said substrate has a "u" shape.

27. The semiconductor module of claim 1, further comprising multiple legs and bends spanning multiple channels.

28. The semiconductor module of claim 1, further comprising at least one additional semiconductor adjacent and electrically coupled to said at least partially conductive layer on an opposite side of a leg to said at least one semiconductor, where said at least one semiconductor and said at least one additional semiconductor share at least one common lead line and electrical contact.

29. A semiconductor module comprising:
a substrate comprising substantially parallel first and second legs joined by a bend, said bend configured to engage with a female connector, said substrate comprising:
an insulator layer that is non-conductive; and
an at least partially conductive layer adjacent and contiguous to said insulator layer;
at least one semiconductor adjacent and electrically coupled to said conductive layer;
a first set of electrical contacts located on said first leg near said bend, where at least some of said first set of electrical contacts are electrically coupled to said conductive layer; and
a second set of electrical contacts located on said second leg near said bend, where at least one of said first set of electrical contacts and at least one of said second set of electrical contacts are electrically coupled to one another.

30. The semiconductor module of claim 29, further comprising a base layer adjacent and contiguous to said insulator layer on an opposite side of said insulator layer to said conductive layer, where said base layer is electrically conductive.

31. The semiconductor module of claim 30, wherein said insulator, conductive, and base layers are made from a bendable material.

32. The semiconductor module of claim 30, wherein said base layer is substantially thicker than said insulator and conductive layers.

33. The semiconductor module of claim 30, wherein a ratio of a thickness of said base layer to said insulator layer is approximately 3.

34. The semiconductor module of claim 30, wherein a ratio of a thickness of said base layer to said at least partially conductive layer is approximately 14.

35. The semiconductor module of claim 30, wherein said base layer is approximately between 100 and 500 micrometers thick.

36. The semiconductor module of claim 30, wherein said base layer is made from a metal selected from a group consisting of: copper, bronze, stainless steel, aluminum and any combination of the afore-mentioned.

37. The semiconductor module of claim 30, wherein said base layer is configured to dissipate heat.

38. The semiconductor module of claim 30, wherein said base layer is configured to discharge electric charge.

39. The semiconductor module of claim 29, wherein said insulator layer is thicker than said conductive layer.

40. The semiconductor module of claim 29, wherein a ratio of a thickness of said insulator layer to said at least partially conductive layer is approximately 5.

41. The semiconductor module of claim 29, wherein said insulator layer is approximately between 25 and 100 micrometers thick.

42. The semiconductor module of claim 29, wherein said insulator layer is chosen to provide a predetermined electrical impedance.

43. The semiconductor module of claim 29, wherein said at least partially conductive layer is approximately between 5 to 30 micrometers thick.

44. The semiconductor module of claim 29, wherein said insulator layer is made from a material selected from a group consisting of: a polyimide, an epoxy, TEFLON and any combination of the afore-mentioned.

45. The semiconductor module of claim 29, wherein said at least partially conductive layer is at least partially made from a metal selected from a group consisting of: copper, bronze, gold and any combination of the afore-mentioned.

46. The semiconductor module of claim 29, wherein said at least partially conductive layer forms patterned traces.

47. The semiconductor module of claim 29, wherein an acute angle is formed at said bend between said legs.

48. The semiconductor module of claim 29, wherein said legs are substantially straight and parallel to one another.

49. The semiconductor module of claim 29, wherein one of said legs is substantially shorter than the other of said legs.

50. The semiconductor module of claim 29, wherein said substrate has a "j" shape.

51. The semiconductor module of claim 29, wherein said substrate has a "u" shape.

52. The semiconductor module of claim 29, further comprising multiple legs and bends spanning multiple channels.

53. The semiconductor module of claim 29, further comprising at least one additional semiconductor adjacent and electrically coupled to said at least partially conductive layer on an opposite side of a leg to said at least one semiconductor, where said at least one semiconductor and said at least one additional semiconductor share at least one common lead line and electrical contact.

* * * * *

UNITED STATES PATENT AND TRADEMARK OFFICE
CERTIFICATE OF CORRECTION

| | |
|---|---|
| PATENT NO. | : 7,122,889 B2 |
| APPLICATION NO. | : 10/894693 |
| DATED | : October 17, 2006 |
| INVENTOR(S) | : Belgacem |

It is certified that error appears in the above-identified patent and that said Letters Patent is hereby corrected as shown below:

On the cover page, at (75) Inventor:

please delete "Haba Belgacem" and insert -- Belgacem Haba --.

Signed and Sealed this

Ninth Day of January, 2007

JON W. DUDAS
*Director of the United States Patent and Trademark Office*